United States Patent

Hsu et al.

[11] Patent Number: 6,040,222
[45] Date of Patent: Mar. 21, 2000

[54] METHOD FOR FABRICATING AN ELECTROSTATISTIC DISCHARGE PROTECTION DEVICE TO PROTECT AN INTEGRATED CIRCUIT

[75] Inventors: Chen-Chung Hsu, Hsinchu Hsien; Yih-Jau Chang, Hsinchu, both of Taiwan

[73] Assignee: United Microelectronics Corp., Hsinchu, Taiwan

[21] Appl. No.: 09/241,950

[22] Filed: Feb. 2, 1999

[51] Int. Cl.[7] ...................... H01L 21/336; H01L 21/8234
[52] U.S. Cl. .......................... 438/301; 438/200; 438/210; 438/275; 438/592; 438/595
[58] Field of Search .................... 438/301, 305, 438/200, 275, 306, 981, 585, 595, 592, 682, 683, 210, FOR 60, 303

[56] References Cited

U.S. PATENT DOCUMENTS

| | | | |
|---|---|---|---|
| 4,441,931 | 4/1984 | Levin | 438/531 |
| 4,677,739 | 7/1987 | Doering et al. | 438/228 |
| 4,874,714 | 10/1989 | Eklund | 438/200 |
| 5,517,049 | 5/1996 | Huang | 257/357 |
| 5,672,898 | 9/1997 | Keller et al. | 257/383 |
| 5,757,051 | 5/1998 | Wu et al. | 257/368 |

*Primary Examiner*—Michael Trinh
*Attorney, Agent, or Firm*—Hickman Stephens Coleman & Hughes, LLP

[57] ABSTRACT

An improved method for fabricating an ESD protection device so as to avoid ESD damage to a wafer. The improved method includes simultaneously forming an internal circuit and the ESD protection device without additional photomask or other process. The improved method uses a $P^+$ doped region to take the place of an $N^-$ doped region of an interchangeable source/drain region with a LDD structure for the ESD protection device, of which its trigger voltage is adjusted by simply varying the $P^+$ concentration.

8 Claims, 2 Drawing Sheets

METHOD FOR FABRICATING AN ELECTROSTATISTIC DISCHARGE PROTECTION DEVICE TO PROTECT AN INTEGRATED CIRCUIT

BACKGROUND OF THE INVENTION

1. Field of the Invention

This invention relates to semiconductor fabrication, and more particularly to a method for fabricating an electrostatic discharge (ESD) protection circuit to protect an integrated circuit with a property of low punch-through voltage.

2. Description of Related Art

In the fabrication of an integrated circuit (IC) device, such as dynamic random access memory (DRAM) or statistic random access memory (SRAM), ESD is one of the main factors causing IC damage. For example, when one walks on a carpet with semi-conductor wafers, if relative humidity (RH) is high, an electrostatic voltage of about a few hundred volts may exist on one's body and wafers. If the RH is very low, the electrostatic voltage may be even as high as about a few thousand volts. If a conductive object occasionally contacts the wafers, a strong ESD could occur and damage the ICs on the wafers. ESD is an especially serious problem for fabrication of a complementary metal-oxide semiconductor (CMOS) device.

In order to protect wafers from ESD damage, many methods to solve the ESD problem have been proposed. The most common conventional method is to make an ESD protection circuit between input/output (I/O) pads and internal circuits so that the ESD does not damage the ICs fabricated on the wafers. Currently, the ESD problem is one of main factors causing damage to the IC device at deep sub-micron level. It is very desired to have an ESD protection circuit, which can effectively protect IC devices from ESD damage.

Moreover, a thinner gate oxide layer is necessary as the device integration increases. This causes that a gate-oxide breakdown voltage is approaching to a junction breakdown voltage of a field effect transistor or even less. In this situation, performance of the original ESD protection circuit is degraded. In addition, a circuit architecture is usually designed by minimum design rules, in which a sufficient distance between a contact and a diffusion-region edge, or a contact and a gate edge is not properly considered and designed. This causes that devices in high integration have poor performance to resist a huge electrostatic transient current and wafers is therefore damaged by the ESD phenomenon.

Typically, the ESD protection is done by a conventional ESD protection circuit including a coupling-type diode or a coupling-type metal-oxide semiconductor (MOS) device. However, both are very power consuming and cannot endure a larger ESD stress. The gate-oxide thickness becomes small as device integration gets high, resulting in a low gate-oxide breakdown voltage. IF the gate-oxide breakdown voltage is as low as about the source/drain junction breakdown voltage, the ESD protection ability is severely degraded.

FIGS. 1A–1D are cross-sectional views, schematically illustrating a conventional fabrication process to form an ESD protection circuit.

In FIG. 1A, an isolation structure 12 is formed on a semiconductor substrate 10 so as to form active regions respectively at a device region 14 for a desired IC device and a protection circuit region 16 for an ESD protection device. The isolation structure 12 can be a field oxide (FOX) structure or a shallow trench isolation (STI) structure. A MOS transistor 18 and a MOS transistor 20 are respectively formed at the device region 14 and the protection circuit region 16. The MOS transistor 18 includes a gate oxide layer 22, a polysilicon gate 24, a spacer 26, and a channel source/drain region 28 with a lightly doped drain (LDD) structure, which includes, for example and $N^+$ region and an $N^-$ doped region. The MOS transistor 20 includes a gate oxide layer 30, a polysilicon gate 32, a spacer 34, and a source/drain region 36 with a lightly doped drain (LDD) structure, which includes, for example, and $N^+$ region and an $N^-$ region.

In FIG. 1B, a photoresist layer 38 is formed over the substrate 10 to cover the device region 14. Using wet etching, the spacer 34 on each sidewall of the polysilicon gate 32 is removed.

In FIG. 1C, at the current stage, the source/drain region 36 at the protection circuit region 16 is exposed. An ion implantation process is performed with a heavy $N^+$ concentration so as to form a source/drain region 36a, in which the LDD structure has been merged away.

In FIG. 1D, the photoresist layer 38 is removed. A spacer 40 is formed on each sidewall of the polysilicon gate 32 by thermal oxidation and etching back. A self-aligned silicide (Salicide) process is performed to form several Salicide layers 42, 43, 44, and 45 on the exposed surface of the source/drain region 28, 36a and the polysilicon gates 24, 32.

A further fabrication process to accomplish the device is well known by the one skilled in the art, and is not further described here.

In the above conventional fabrication process, the IC device and the ESD protection device are simultaneously formed. In this conventional ESD protection structure, the source/drain region 36a is heavily doped with N-type dopants so as to reduce junction resistance and to allow the power consumption rate to be evenly distributed. However, the junction breakdown voltage still cannot be reduced. As a result, the conventional ESD device cannot effectively protect the internal IC device with a gate-oxide thickness of about 35 angstroms or less.

SUMMARY OF THE INVENTION

It is at least an objective of the present invention to provide a method for fabricating an ESD protection device so as to avoid ESD damage to a wafer as a thickness of a gate oxide layer is greatly reduced in a highly integrated circuit, inducing a huge electrostatic transient current.

In accordance with the foregoing and other objectives of the present invention, an improved method for fabricating an ESD protection device is provided so as to avoid ESD damage to a wafer. The improved method includes simultaneously forming an internal circuit and the ESD protection device without additional photomask or other process. The improved method uses a $P^+$ doped region to take the place of an $N^-$ doped region of an interchangeable source/drain region with a LDD structure for the EDS protection device, of which its trigger voltage can be adjusted by simply varying the $P^+$ concentration. The ESD protection device with low trigger voltage is achieved so as to effectively protect the internal circuit as a gate oxide layer becomes thinner in accordance a high integration design.

BRIEF DESCRIPTION OF THE DRAWINGS

The invention can be more fully understood by reading the following detailed description of the preferred embodiment, with reference made to the accompanying drawings as follows.

DETAILED DESCRIPTION OF PREFERRED EMBODIMENT

The method provided by the invention forms an interchangeable source/drain region with a $P^-$ doped region for the ESD protection device, in which the $P^-$ doped region takes the place of a lightly doped region in the LDD structure. An ESD trigger voltage can be adjusted by varying the $P^+$ dopant concentration.

Figure 1A:
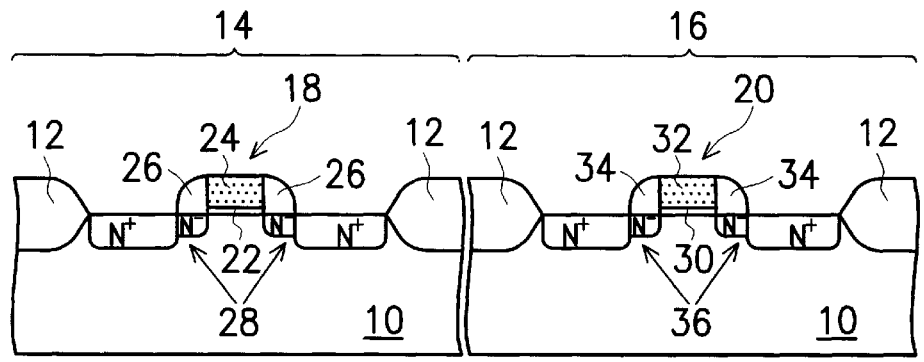
FIGS. 1A–1D are cross-sectional views of a portion of a substrate, schematically illustrating a conventional fabrication process to form an ESD protection circuit.
Figure 1B:
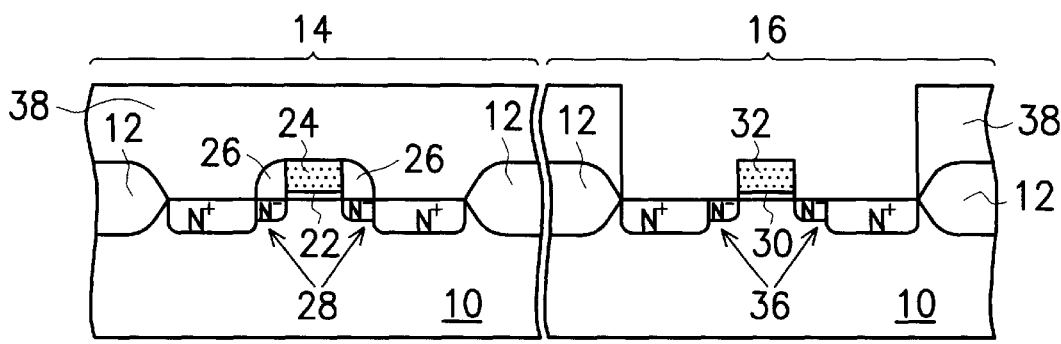
Figure 1C:
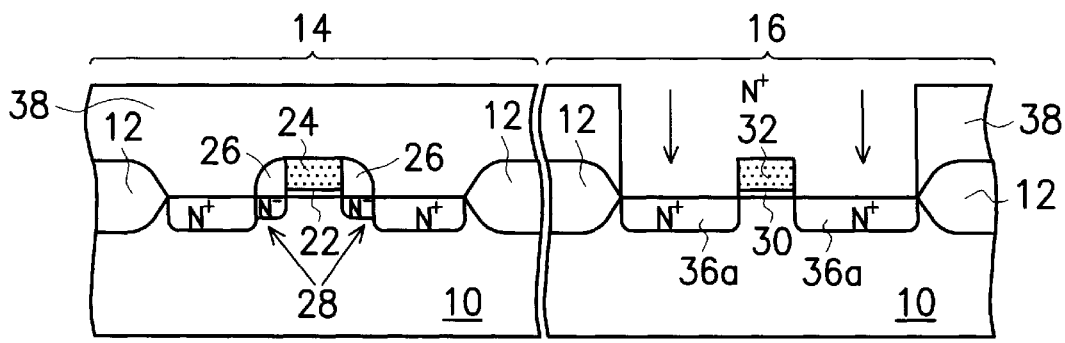
Figure 1D:
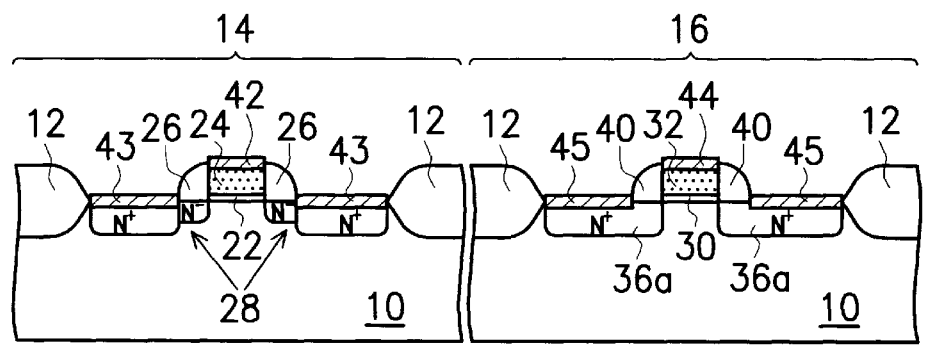
Figure 2A:
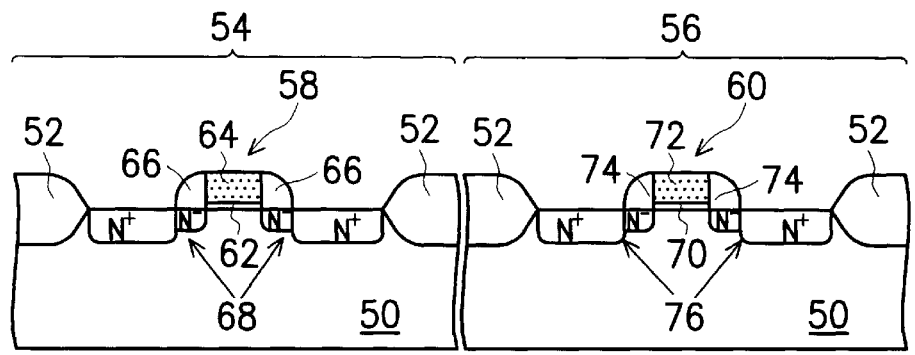
FIGS. 2A–2D are cross-sectional views of a portion of a substrate, schematically illustrating a fabrication process to form and ESD protection circuit, according to a preferred embodiment of the invention.
Figure 2B:
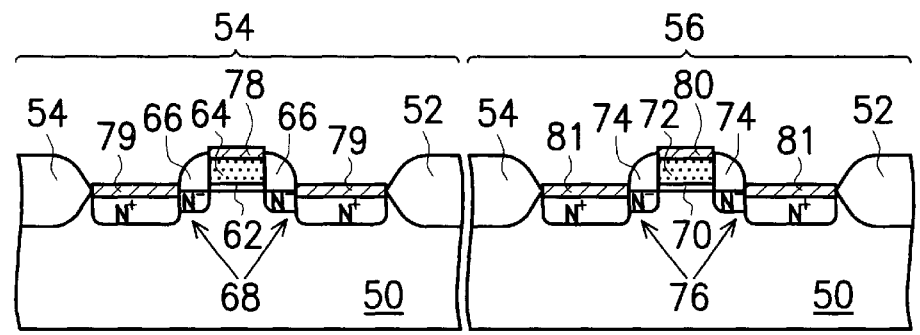
Figure 2C:
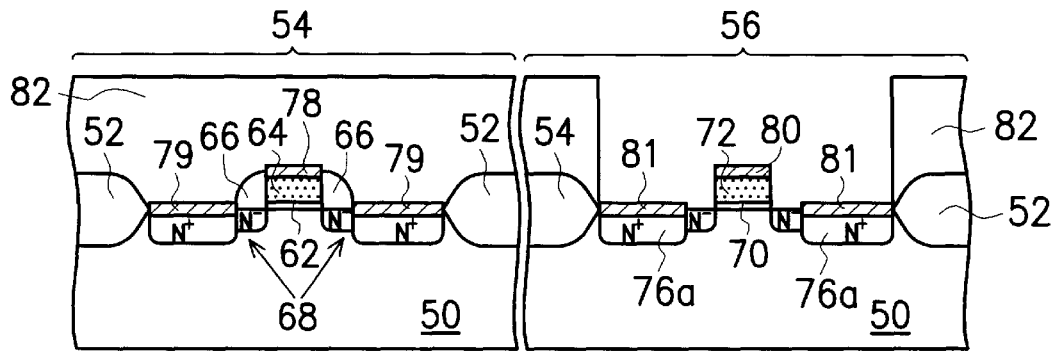
Figure 2D:
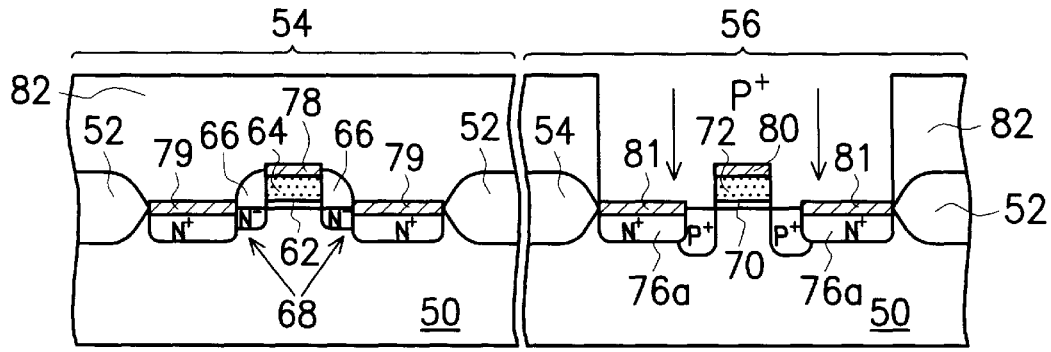

FIGS. 2A–2D are cross-sectional views of a portion of a substrate, schematically illustrating a fabrication process to form an ESD protection circuit, according to a preferred embodiment of the invention. In FIG. 2D similar to FIG. 1A, an isolation structure 52 is formed on a semiconductor substrate 50 so as to form active regions respectively at a device region 54 for a desired IC device and a protection circuit region 56 for an ESD protection device, such as an N-type MOS transistor. The isolation structure 52 can be a field oxide (FOX) structure or a shallow trench isolation (STI) structure. A MOS transistor 58 and a MOS transistor 60 are respectively formed at the device region 54 and the protection circuit region 56. The MOS transistor 58 includes a gate oxide layer 62, a gate 64, a spacer 66, and an interchangeable source/drain region 68 with a lightly doped drain (LDD) structure, which includes, for example, an $N^+$ region and an $N^-$ doped region. The MOS transistor 60 includes a gate oxide layer 70, a gate 72, a spacer 74, and a source/drain region 76 with a lightly doped drain (LDD) structure, which includes, for example, and $N^+$ region and an $N^-$ region.

In FIG. 2B, a Salicide process is performed to form several Salicide layers 78, 79, 80, and 81 on the gates 64, 72 and the source/drain regions 68, 76 at the $N^+$ doped regions.

In FIG. 2C, a photoresist layer 82 is formed over the substrate 50 and is patterned to expose the MOS transistor 60 at the protection circuit region 56. The spacer 74 on each sidewall of the gate 72 is removed by, for example, wet etching so that the $N^-$ lightly doped region originally covered by the spacer 74 of FIG. 2B is exposed. A remaining portion of the $N^+$ source/drain region 76 covered by the Salicide layer 81 becomes an N+ source/drain region 76a.

In FIG. 2D, a doping process, such as an ion implantation process, is performed to dope the exposed $N^-$ lightly doped region so that a $P^+$ doped region is formed abutting the N+ source/drain region 76a. The $P^+$ doped region taking the place of the $N^-$ lightly doped region includes the P-type dopants, such as boron ions, with a dosage density of about $1 \times 10^{14}$–$1 \times 10^{16}$ ions/cm$^2$, and an ion beam energy of about 30–100 KeV. As a result, the $P^+$ doped region and the N+ source/drain region 76a form a diode structure.

A further fabrication process to accomplish the device is well known by the one skilled in the art, and is not further described here.

In the invention, it is only an example that the ESD protection device includes the N-type MOS transistor. The method provided by the invention is also suitable for a P-type MOS transistor to fabricate the ESD protection device. The main feature is that a P-N diode structure is formed abutting the gate 72. A sufficiently low ESD triggers voltage can be adjusted by varying the concentration of $P^+$ or $N^+$. The gate oxide layers 62, 70 with greatly reduced thickness are protected due to a low ESD trigger voltage. Moreover, the low ESD trigger voltage results in a low power consuming rate and a low thermal effect, both of which further protect the internal circuit on the wafer from the ESD effects. Furthermore, the ESD protection device of the invention can also reduce a punch-through effect. For an internal circuit at the 0.18 micron fabrication level with a gate-oxide thickness about less than 35 angstroms, the ESD protection device has a trigger voltage as low as about 3V–5V. For a convention ESD trigger voltage is about 10V–15V. The ESD protection device provided by the invention has a significant improvement.

Moreover, the ESD protection device is simultaneously formed as the internal circuit is formed. There is no need to include addition photomask or other fabrication process. The invention, for example, needs only change the dopant type during the doping process so as to form a P-N diode structure in the source/drain region for the EDS MOS transistor.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an electrostatic discharge (ESD) protection device, which is simultaneously formed while an internal circuit is formed, wherein an isolation structure is formed on a semiconductor substrate to define a device region and a protection circuit region, a first metal-oxide semiconductor (MOS) transistor and a second MOS transistor are respectively formed on the device region and the protective circuit region, in which the first MOS transistor comprises a first gate structure and a first interchangeable source/drain region with a first lightly doped drain (LDD) structure, and the second MOS transistor comprises a second gate and a second interchangeable source/drain with a second lightly doped drain (LDD) structure, of which the second interchangeable source/drain region is doped with a first-type dopant, the method comprising:

performing a self-aligned silicide (Salicide) process over the substrate;

removing a spacer of the second MOS transistor at the protection circuit region so as to expose a portion of the second interchangeable source/drain region in the substrate, wherein the spacer is on each sidewall of the second gate of the second MOS transistor; and implanting a second-type dopant into the exposed portion of the second interchangeable source/drain region to form a second-type dopant region so as to form a diode structure.

2. The method of claim 1, wherein the step of implanting the second-type dopant into the exposed portion of the second interchangeable source/drain region further comprises a photoresist layer that is formed over the substrate to cover the device region before implanting the second-type dopant, and is removed after implanting the second-type dopant.

3. The method of claim 1, wherein the isolation structure comprises a field oxide (FOX) structure.

4. The method of claim 1, wherein the isolation structure comprises a shallow trench isolation (STI) structure.

5. The method of claim 1, wherein if the first-type dopant is an N-type dopant, the second-type dopant is a P-type dopant.

6. The method of claim 1, wherein if the first-type dopant is a P-type dopant, the second-type dopant is an N-type dopant.

7. The method of claim 1, wherein the second type-dopant comprises boron ions with an ion beam energy of about 30–100 KeV and a dosage density of about $1\times10^{14}1\times10^{16}$ ions/cm$^2$.

8. The method of claim 1, wherein the step of removing the spacer comprises wet etching.

\* \* \* \* \*